United States Patent
Li et al.

(10) Patent No.: US 7,737,026 B2
(45) Date of Patent: Jun. 15, 2010

(54) STRUCTURE AND METHOD FOR LOW RESISTANCE INTERCONNECTIONS

(75) Inventors: Ying Li, Newburgh, NY (US); Keith Kwong-Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 11/693,153

(22) Filed: Mar. 29, 2007

(65) Prior Publication Data

US 2008/0237869 A1 Oct. 2, 2008

(51) Int. Cl.
*H01L 21/4763* (2006.01)

(52) U.S. Cl. .................... 438/637; 438/627; 438/624; 438/638; 438/622; 257/752; 257/251; 257/751; 257/622

(58) Field of Classification Search ................ 438/637, 438/627, 691, 624, 638, 622; 257/752, 251, 257/751, 622
See application file for complete search history.

(56) References Cited

U.S. PATENT DOCUMENTS

| | | | |
|---|---|---|---|
| 6,028,362 A | 2/2000 | Omura | |
| 6,157,081 A * | 12/2000 | Nariman et al. | 257/752 |
| 6,562,715 B1 | 5/2003 | Chen | |
| 2003/0194858 A1 | 10/2003 | Lee | |
| 2004/0209456 A1 * | 10/2004 | Farrar | 438/627 |
| 2005/0250314 A1 * | 11/2005 | Park | 438/627 |
| 2006/0097397 A1 | 5/2006 | Russell | |
| 2006/0240187 A1 | 10/2006 | Weidman | |

* cited by examiner

*Primary Examiner*—Matthew Smith
*Assistant Examiner*—Wilner Jean Baptiste
(74) *Attorney, Agent, or Firm*—Cantor Colburn LLP; Yuanmin Cai

(57) ABSTRACT

A method of forming an interconnection in a semiconductor device includes forming a first liner in a dielectric layer therein; depositing a tungsten filler on top of the first liner; performing chemical mechanical planarization (CMP) to smooth out and remove the first liner and tungsten filler from the semiconductor's exposed surface; selectively removing the first liner and tungsten filler in the via; wherein the selective removing results in the first liner and the tungsten filler being removed in an upper region of the via; forming a second liner in the upper region of the via and tungsten filler; selectively removing the second liner from the tungsten filler; forming a copper seed layer on top of the tungsten filler; depositing a copper filler on top of the copper seed layer; and performing chemical CMP to smooth out and remove the second liner and copper filler from the semiconductor's exposed surface.

12 Claims, 2 Drawing Sheets

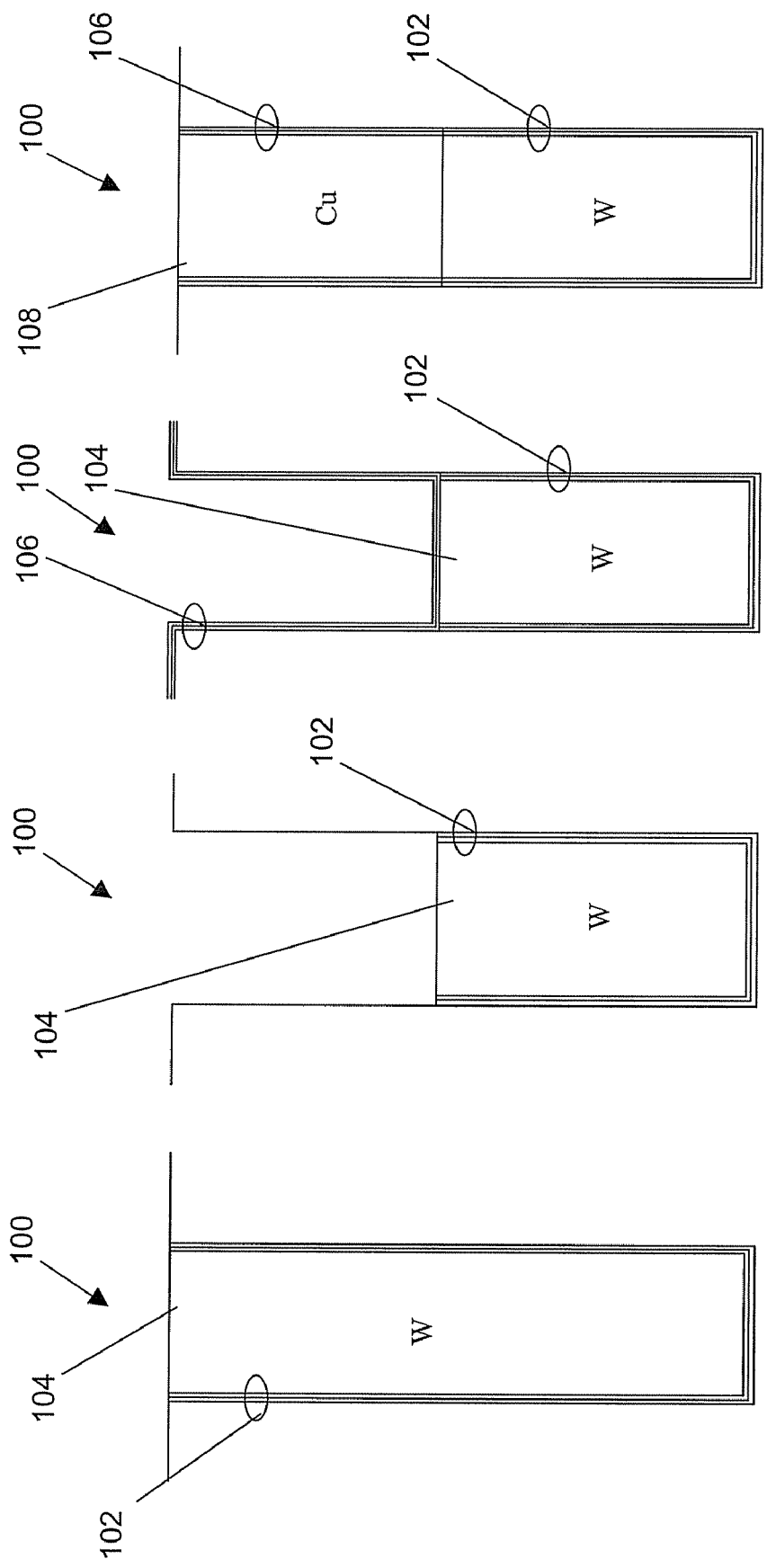

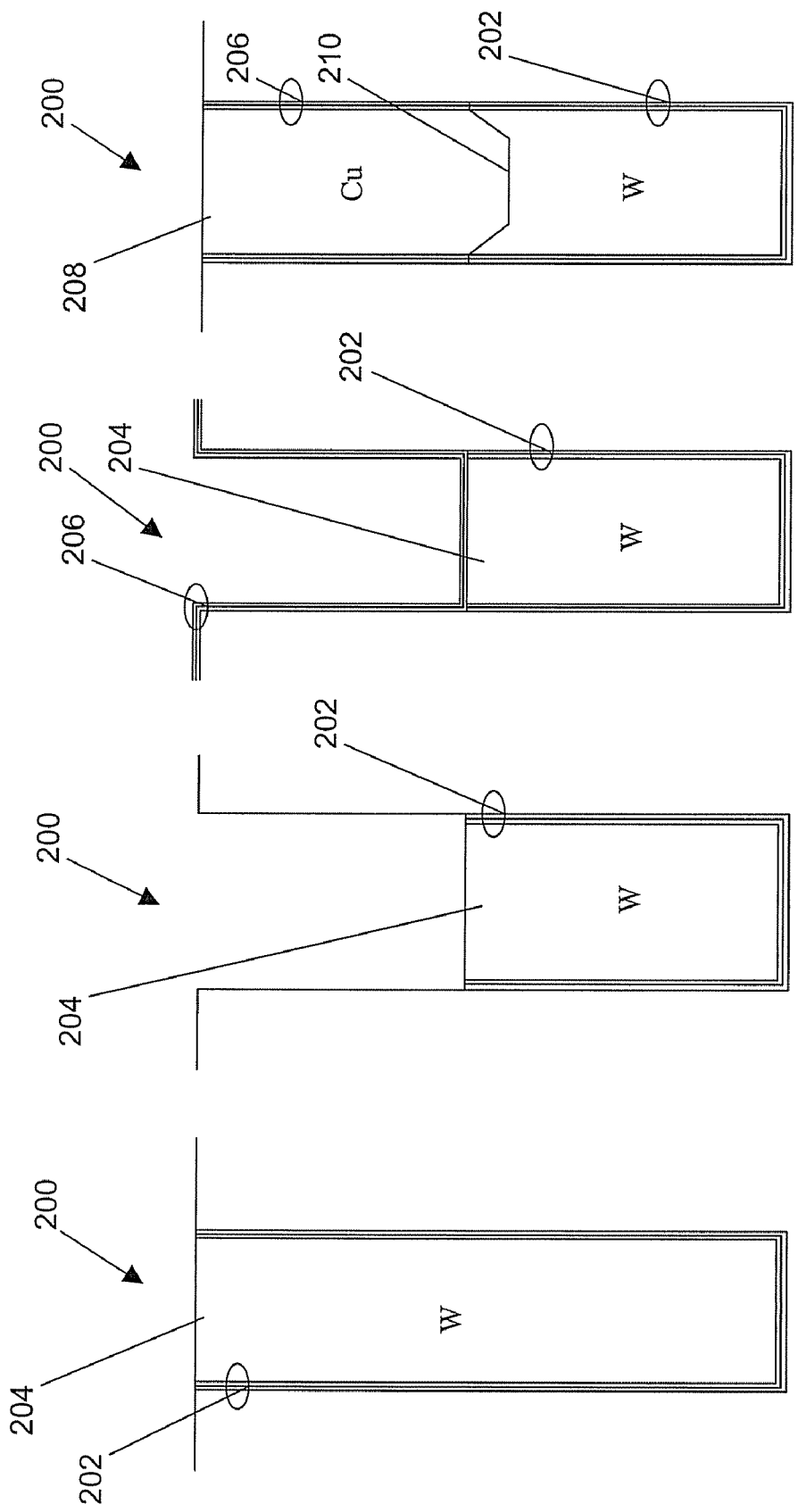

STRUCTURE AND METHOD FOR LOW RESISTANCE INTERCONNECTIONS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates generally to semiconductor manufacture and more particularly to structures and methods for forming low resistance, high aspect ratio interconnections.

2. Description of the Background

The increasing densities and continued miniaturization of microelectronic features has lead to the increased usage of high aspect ratio (AR) (defined as the ratio of height to width) features. For example, in very large scale integration (VLSI) high aspect ratio features include contacts, vias, lines, and other apertures. Reliable formation of high aspect ratio features is a key to the continued evolution of VLSI and microelectronic design.

However, contact resistance increases exponentially with technology scaling. Until recently, tungsten (W) has been the metal of choice for filling VLSI features, however the need to reduce contact resistances has lead to the introduction of alternative conductive fillers. Copper (Cu) is being considered as an alternative conductive metal for filling the VLSI features due to its low resistivity, however copper readily diffuses into neighboring layers, such as dielectric layers and silicon. Such Cu diffusion causes current leakage and reliability failure in circuits. Diffusion barriers or liners are introduced to prevent the copper diffusion, to encapsulate the copper interconnect, and to provide improved adhesion to the dielectric layers. For high aspect ratio features, the diffusion barrier should be thin and uniform in order to avoid the introduction of substantial resistance to the interconnection. Preferred diffusion barrier materials are refractory materials such as tantalum, tungsten, tantalum nitride, tungsten nitride, titanium and titanium nitride. However, the additional resistance introduced by the liner/diffusion barrier has the potential to mitigate the advantages of copper over tungsten. In addition, conformality of barrier/liner films and Cu fill integrity degrades significantly with increasing aspect ratios.

SUMMARY OF THE INVENTION

Embodiments of the present invention comprise a structure and a method for forming an interconnect in a semiconductor. In one embodiment, the method includes: forming a first liner on the sidewalls and bottom region of a via formed in a dielectric layer of the semiconductor; depositing a tungsten filler on top of the first liner; performing chemical mechanical planarization (CMP) to smooth out and remove the first liner and tungsten filler from the top of the semiconductor's exposed surface; patterning and selectively removing the first liner and tungsten filler in the via; wherein the selective removing results in the first liner and the tungsten filler being removed in an upper region of the via; forming a second liner on the sidewalls of the upper region of the via and on the upper surface of the tungsten filler; patterning and selectively removing the second liner from the upper surface of the tungsten filler; forming a copper seed layer on top of the tungsten filler; depositing a copper filler on top of the copper seed layer; and performing chemical mechanical planarization (CMP) to smooth out and remove the second liner and copper filler from the top of the semiconductor's exposed surface.

In another embodiment, a conductive interconnect structure in a semiconductor, includes: a first liner on the lower sidewalls and bottom region of a via formed in a dielectric layer of the semiconductor; a tungsten filler in the lower region of the via as defined by the first liner; a second liner extending from the top of the first liner on the upper region sidewalls of the via; a copper seed layer in direct contact with the upper surface of the tungsten filler; and a copper filler in direct contact with the copper seed layer that extends to the top of the via.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, a solution is technically achieved in which structures and methods for forming low resistance, high aspect ratio hybrid contacts/interconnections are implemented in an integrated circuit. The lower contact resistance is realized by the partial fill of Cu with W in the contact hole, and the elimination of the resistive liner between Cu and W interface and the resultant series resistance between the Cu and W. An anchor contact between the Cu and W provides an enhanced contact area and hence lower contact resistance between the Cu and W. The partial fill of the contact hole with W lowers the aspect ratio for the Cu seed/Cu plating thereby improving liner/Cu seeding/Cu plating integrity. In addition, filling the lower portion of the contact with W prevents Cu from directly contacting silicide and Si surfaces and hence prevents Cu diffusion in Si.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 1A-1D are a sequence of cross sectional views illustrating a method of forming a bottomless copper and tungsten based hybrid interconnect/contact according to an embodiment of the invention.

FIGS. 2A-2D are a sequence of cross sectional views illustrating an alternative method of forming a bottomless copper and tungsten based hybrid interconnect/contact with an anchor according to an embodiment of the invention.

The detailed description explains the preferred embodiments of the invention, together with advantages and features, by way of example with reference to the drawings.

DETAILED DESCRIPTION OF SPECIFIC EMBODIMENTS

Embodiments of the present invention provide a structure and method for forming low resistance, high aspect ratio hybrid contacts/interconnections for an integrated circuit. The lower contact resistance is realized by the partial fill of Cu with W in the contact void, and the elimination of a liner and the resultant series resistance between the Cu and W. An anchor contact between the Cu and W provides an enhanced electrical contact between the Cu and W. The partial fill of the contact void with W lowers the aspect ratio for the Cu seed/Cu plating thereby improving liner/Cu seeding/Cu plating integrity. Filling lower portion of the contact hole with W prevents Cu from directly contacting silicide and Si surface and hence prevents Cu diffusion in Si It is to be understood and appreciated that the process steps and structures described below do not cover a complete process flow. The present invention embodiments can be practiced in conjunction with various integrated circuit fabrication techniques that are used in the art, and only so much of the commonly practiced process steps are included herein as are necessary to provide an understanding of the present invention.

FIGS. 1A-1D illustrate the formation of a hybrid bottomless W/Cu interconnection contact 100, in accordance with an embodiment of the invention. In FIG. 1A a liner 102 of titanium (Ti) and titanium nitride (TiN) is deposited along the walls and base of the interconnect 100. Conventional deposition techniques, such as physical vapor deposition (PVD), atomic layer deposition (ALD), and chemical vapor deposition (CVD) can be employed to form the liner/diffusion barrier. A tungsten filler 104 is deposited in the interconnect 100, and chemical mechanical planarization (CMP) is performed to smooth out and remove excess liner and tungsten material from the dielectric's exposed surface. The filler may be deposited by using conventional deposition techniques, such as chemical vapor deposition (CVD), physical vapor deposition (PVD), and atomic layer deposition (ALD). In FIG. 1B a selective etch (dry or wet) is performed to partially remove the liner 102 and a portion of the tungsten filler 104. In FIG. 1C a liner 106 of tantalum (Ta) and tantalum nitride (TaN) is deposited above the remaining tungsten filler 104. In FIG. 1D a sputter process is conducted in an inert gas, such as argon (Ar), xenon (Xe), or other inert gas to remove the portion of the Ta/TaN liner 106 above the W 104. A Cu seed layer (not shown) is deposited on the top surface of the exposed tungsten filler 104, and along the sidewall of the upper portion of the contact hole. Subsequently, Cu filler 108 is deposited above the exposed tungsten filler 104, and CMP is performed to smooth out and remove excess liner 106 and Cu filler 108 from the top surface of the contact 100.

The hybrid W/Cu interconnect structure formed in FIGS. 1A-1D is advantageous since barrier liner and Cu seed step coverage is severely compromised for AR>6 and contact sizes of 60 nm and below, thereby limiting the ability to effectively Cu fill by plating. The partial fill of the contact with liners and W, followed with an additional liner and the remaining contact filled with copper filler offers the following advantages: lower overall contact resistance with partial fill of Cu with W; and lowered AR for liner/Cu seed deposition since part of the contact is filled with W and hence improved liner/Cu seeding/Cu plating integrity; and elimination of Cu diffusion in Si since the lower part of W fill prevents Cu from directly contacting Si or silicide.

FIGS. 2A-2D illustrate an alternative embodiment of the invention with an anchor contact between the Cu and W that provides an enhanced electrical contact between the Cu and W. In FIG. 2A a liner 202 of titanium (Ti) and titanium nitride (TiN) is deposited along the walls and base of the interconnect 200. A tungsten filler 204 is deposited in the interconnect 200, and CMP is performed to smooth out and remove excess liner and tungsten material from the semiconductor's exposed surface. In FIG. 2B a selective etch (dry or wet) is performed to partially remove the liner 202 and a portion of the tungsten filler 204. In FIG. 2C a liner 206 of tantalum (Ta) and tantalum nitride (TaN) is deposited above the remaining tungsten filler 204 and along the sidewall of the upper portion of the contact. In FIG. 2D a sputter etch process is performed to remove the portion of the Ta/TaN liner 206 above the tungsten filler 204, and portions of the tungsten filler 204 to form an anchor interface 210. A Cu seed layer (not shown) is deposited on the top surface of the anchor interface 210 of the exposed W filler 204. Subsequently, Cu filler 208 is deposited above the Cu seed layer, and CMP is performed to smooth out and remove excess liner 206 and Cu filler 208 from the top surface of the contact 200.

The depth and shape of the anchor interface 210 can be modulated by the physical sputtering conditions such as RF power, nature and pressure of the inert gas, substrate bias, and sputtering time. A preferred depth of the anchor interface 210 is within a range of about 2 nm to about 20 nm into the W filler 204. During the sputtering process, the barrier and W is re-deposited onto the sidewall, resulting in a slightly tapered sidewall profile.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of forming an interconnection in a semiconductor, the method comprising:
   forming a first liner on the sidewalls and bottom region of a via formed in a dielectric layer of the semiconductor;
   depositing a tungsten filler on top of the first liner;
   performing chemical mechanical planarization (CMP) to smooth out and remove the first liner and tungsten filler from the top of the semiconductor's exposed surface;
   selectively removing the first liner and tungsten filler in the via;
   wherein the selective removing results in the first liner and the tungsten filler being removed in an upper region of the via;
   forming a second liner on the sidewalls of the upper region of the via and on the upper surface of the tungsten filler;
   selectively removing the second liner from the upper surface of the tungsten filler;
   forming a copper seed layer on top of the tungsten filler and along the sidewalls of the upper region of the via;
   depositing a copper filler on top of the copper seed layer; and
   performing chemical mechanical planarization (CMP) to smooth out and remove the second liner and copper filler from the top of the semiconductor's exposed surface.

2. The method of claim 1, wherein the first liner and the second liner comprise one or more of the following refractory materials: tantalum, tungsten, tantalum nitride, tungsten nitride, titanium, and titanium nitride.

3. The method of claim 1, wherein the first liner comprises a layer of titanium and a layer of titanium nitride.

4. The method of claim 1, wherein the first liner comprises a layer of titanium and a layer of tungsten nitride.

5. The method of claim 1, wherein the second liner comprises a layer of tantalum and a layer of tantalum nitride.

6. The method of claim 1, wherein the selective removing of the first liner and tungsten filler in the upper region of the via is performed by a dry or a wet etching process.

7. The method of claim 1, wherein chemical vapor deposition is used to dispose the first and the second liners.

8. The method of claim 1, wherein physical vapor deposition is used to dispose the first and second liners.

9. The method of claim 1, wherein atomic layer deposition is used to dispose the first and the second liners.

10. The method of claim 1, wherein selectively removing the second liner from the upper surface of the tungsten filler is conducted with a sputtering process in an inert gas.

11. The method of claim 1, further comprising forming an anchor in the upper surface of the tungsten filler by a sputter etch during the selective removal of the second liner;

wherein the anchor has downward angled walls that end in a flat surface; and wherein the anchor serves as an interface for the copper and tungsten filler.

12. The method of claim 11, wherein the depth and shape of the anchor is modulated by the sputter etch conditions including one or more of: RF power, the nature and pressure of the inert gas, substrate bias, and sputtering time;

wherein the depth is within a range of about 2 nm to about 20 nm into the tungsten filler; and wherein during the sputtering process, the second liner and the tungsten filler are re-deposited onto the sidewalls of the upper region of the via.

\* \* \* \* \*